United States Patent [19]
Klein et al.

[11] Patent Number: 5,289,869
[45] Date of Patent: Mar. 1, 1994

[54] CLOSED LOOP FEEDBACK CONTROL VARIABLE CONDUCTANCE HEAT PIPE

[76] Inventors: John F. Klein, 51 Madison Park Gardens, Port Washington, N.Y. 11050; Robert L. Kosson, 19 Cambridge Dr., Massapequa, N.Y. 11758; John A. Quadrini, 37 Woodfield Ave., Northport, N.Y. 11768

[21] Appl. No.: 993,233
[22] Filed: Dec. 17, 1992
[51] Int. Cl.⁵ .................. H01L 23/427; F28D 15/02
[52] U.S. Cl. ........................ 165/32; 165/104.24; 165/104.29; 165/104.33; 361/699
[58] Field of Search ............ 165/32, 96, 104.24, 165/104.29, 104.33; 361/385

[56] References Cited
U.S. PATENT DOCUMENTS 3,887,759  6/1975  Staub et al. .................. 165/104.24
4,162,701  7/1979  Ollendorf ........................ 165/32

*Primary Examiner*—Albert W. Davis, Jr.
*Attorney, Agent, or Firm*—Pollock Vande Sande and Priddy

[57] ABSTRACT

A variable conductance heat pipe includes an electronic component mounting plate serving as the evaporator of the heat pipe. The evaporator is connected to an air cooled condenser which condenses vapor flowing from the evaporator. The evaporator has a sump located at the lowest gravity point of the evaporator passage. By either vaporizing or pumping liquid from the sump and passing it back through the heat pipe a continuing wetted condition exists in the heat pipe which can accommodate heat dissipation transients by the electronic components. A control loop is closed through the heat pipe for controlling the penetration of an inert gas into the heat pipe condenser to maintain a constant temperature for the electronic components mounted thereto.

2 Claims, 3 Drawing Sheets

CLOSED LOOP FEEDBACK CONTROL VARIABLE CONDUCTANCE HEAT PIPE

FIELD OF THE INVENTION

The present invention relates to temperature control of electronic components and more particularly to an electronic mounting plate which includes a variable conductance heat pipe.

BACKGROUND OF THE INVENTION

In many applications, temperature control of electronic components is critical. For example, as a resistor heats up, the resistance itself increases and this can seriously alter the operation of the circuit in which the resistor is connected. In sensitive applications, a simple mechanical heat sink is insufficient to maintain a constant temperature.

Frequently, heat pipes are employed for cooling the environment of electronic circuits. However, they normally operate with a range of temperature variations which may be unacceptable for sensitive applications. More complicated refrigeration techniques, having feedback temperature control, may be employed. Unfortunately, they are quite expensive, require substantial power, and demonstrate limited reliability due to their complicated electromechanical nature.

BRIEF DESCRIPTION OF THE PRESENT INVENTION

With the present system, closed loop feedback control of a variable conductance heat pipe (VCHP) ensures that an electrical component mounting plate section is maintained at a constant and uniform temperature due to a combination of design features including:
a continuous recirculation of working fluid vapor/liquid through the mounting plate;
adjustment of the working fluid vapor/liquid temperature by opening and closing the VCHP condenser via a closed loop control;
and a mounting plate design and insulation which provides the capability to respond to changes in working fluid vapor temperature.

The mounting plate is in effect the VCHP evaporator and a continuous flow of vapor through the VCHP passages is maintained by heating a sump at a constant power level. Vapor flows through the passages in the mounting plate to the condenser. As the vapor condenses to liquid, the liquid returns to the sump by running down connecting tubing and the internal plate passages. Continuous recirculation of vapor and liquid is used to provide the capacity to respond to heat dissipation changes in electronic components mounted to the mounting plate. Vapor/liquid recirculation and its capacity relative to the overall heat-load power swing from components mounted on the mounting plate is critical to the inventive device. An alternative means for providing continuous circulation through the internal plate passages is the use of a bubble pump which connects the sump to the condenser. This would achieve the desired liquid circulation with less heater power than required by evaporation. Inside surfaces of the plate and tubing passages are designed to have spiral grooves which ensure that all surfaces of the passages are wetted with liquid at all times. This ensures near-uniform temperature on the passage surfaces and on the heated surfaces of the mounting plate. It is anticipated that in addition, a series of internal recesses distributed along the tubing passages may be included to retain a reserve supply of liquid to handle power transients.

Heat input at the sump as well as heat generated from the mounted electronic components is dissipated by the heat pipe condenser. Vapor flow within the heat pipe transports the heat from the mounting plate (serving as an evaporator section) to the condenser. Heat is released at the internal condenser surface when the vapor condenses.

An inert gas blocks part of the interior condenser surface. This blockage inhibits heat transfer on the inside surfaces of the VCHP in the blocked condenser. Heat transfer is inhibited because the vapor must diffuse through the inert gas in order to reach the condenser surface. Because of the low rate of diffusion, the heat transfer coefficient is significantly lower than the pure vapor condensation heat transfer film coefficient on the unblocked portion of the condenser. Increasing condenser blockage closes the heat pipe, reducing the vapor condensation heat transfer area.

Condenser opening/closing (unblocking/blocking) is varied by adjusting the inert gas reservoir temperature. Temperature of an inert gas reservoir is controlled by balancing power input from a resistance heater on the gas reservoir against heat loss to the ambient by the gas reservoir.

When the component power changes, the plate temperature will start to change. Plate temperature is sensed by a controller using a thermocouple located in the middle of the bottom plate surface. When a plate surface temperature change is sensed, the controller adjusts the amount of condenser blockage by changing the inert gas reservoir temperature. Adjusting condenser blockage adjusts the heat pipe vapor temperature and thereby the temperature of the mounted electronic components. When the mounted component power increases (tending to raise mounting plate temperature, the VCHP is opened (unblocked) increasing the active condenser heat transfer area and reducing the heat pipe vapor temperature.

The condenser and gas reservoir are cooled by heat rejection to the ambient. The plate and all surfaces of the VCHP are insulated to minimize heat loss except for the condenser and the gas reservoir.

Accordingly, the previous description of the invention makes it clear that a variable capacity heat pipe heat sink can operate at a constant and uniform temperature by including a sump that is heated or pumped to ensure a constant working fluid flow through the heat pipe. Further, successful performance by the present invention requires the utilization of a closed feedback control loop. The result is the maintenance of heat sensitive electronic components at a constant temperature.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
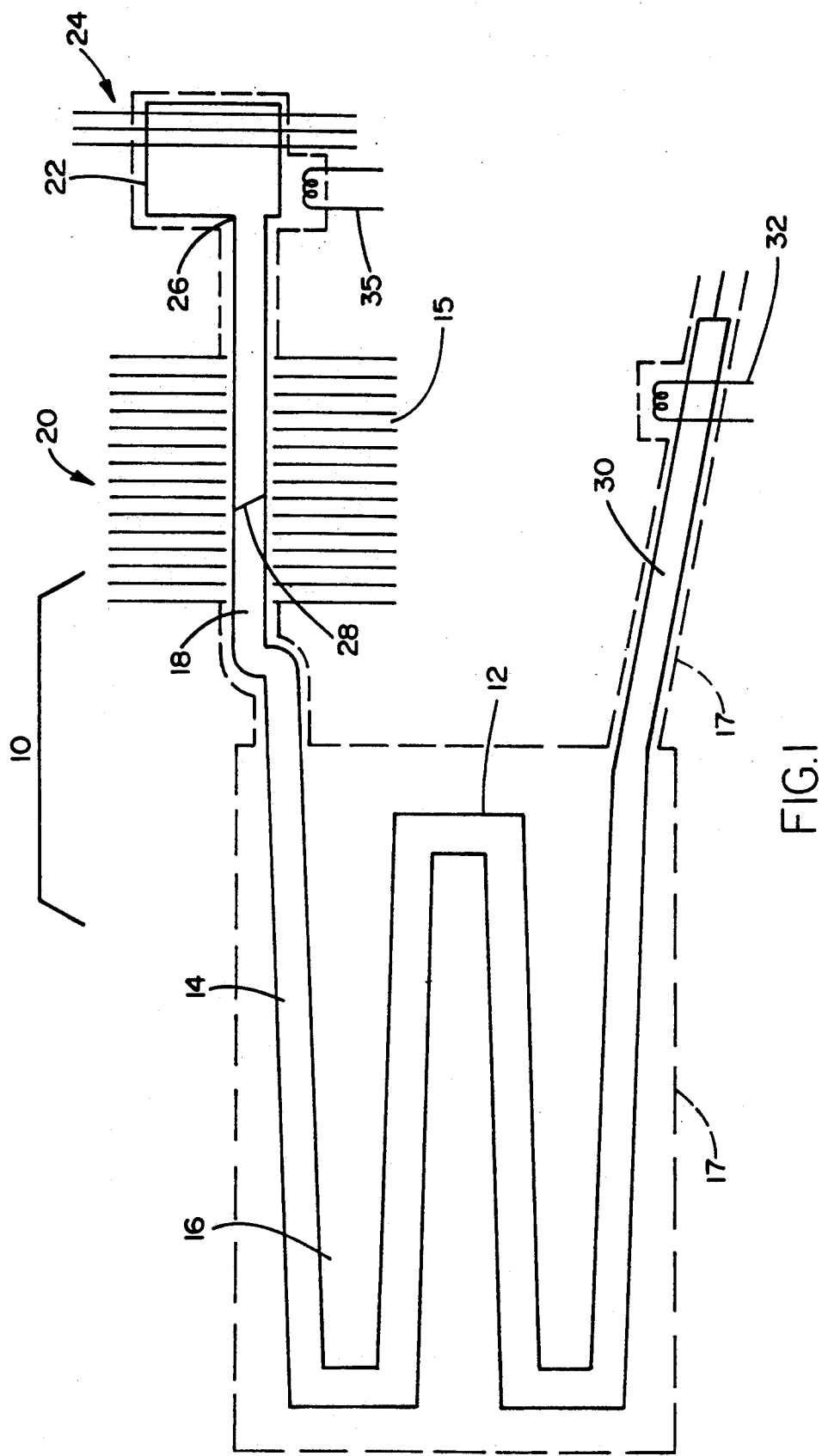
FIG. 1 is a diagrammatic illustration of a VCHP in accordance with the present invention.

Referring to the figures and more particularly FIG. 1 thereof, the mechanical connection of the various components constituting the present invention is diagrammatically illustrated. Reference numeral 10 collectively indicates a heat pipe including the evaporator 12 which includes a metallic heat sink body 16 and internal passages 14 through which working vapor/liquid flows. The heat sink 16 may mount various electronic components thereon thus serving as a mounting plate. The purpose of the present invention is the maintenance of a constant and uniform temperature distribution in the heat sink body which results in a uniform temperature of the electronic components mounted thereon. The heat sink 16 is enclosed within an insulator jacket 17 to further maintain the desired constant and uniform temperature distribution by assuring that almost all the heat dissipated within the insulation is rejected through the heat pipe condenser.

Heat from the electronic components is absorbed by the working fluid of the heat pipe (preferably liquid ammonia) and after vaporization in the evaporator 12 the working vapor flows through the passage 18 of a condenser 15. An assembly of fins 20 are mounted to the passage 18 so that air cooling of the condenser is effected.

In order to automatically adjust for the amount of heat convected by condenser 15, the degree of liquid vapor penetration through the passage 18 is controlled by introducing an inert gas such as nitrogen from an interconnected reservoir 22. This reservoir is maintained in a relatively cool state by the attachment of fins 24 thereto. The interface region between the inert gas and the working vapor is indicated by reference numeral 28.

Physically speaking, the total pressure, which is the sum of the partial pressures of the vapor (working fluid vapor) and gas (inert gas) must be the same in the passage of the condenser as throughout the evaporator 12. Thus, as greater heat is introduced into the heat sink 16 due to increased power dissipation of mounted electronic components, the control system senses a rise in temperature and acts to decrease the power to the heater 35 and hence the temperature of the gas reservoir 22. The interface 28 will then shift to the right, thereby raising the inert gas partial pressure and exposing a longer section of the condenser to working fluid vapor. Greater penetration of working fluid vapor into the condenser will result in a greater amount of heat being expelled due to the fact that the working fluid vapor has a higher heat transfer film coefficient and exists over a larger surface area. The result is a slightly lower vapor pressure and temperature in the evaporator, permitting heat sink 16 to return to the control temperature.

In the opposite situation where the electronic component starts to dissipate less heat, the control system senses a drop in temperature and acts to increase the power to heater 35 and hence the temperature of the gas reservoir 22. The interface 28 will then shift to the left, lowering the inert gas partial pressure and reducing the section of condenser exposed to working fluid vapor. This results in a decreasing heat rejection by the condenser 15 thereby limiting the cooling of the working vapor and consequently raising the working fluid vapor temperature. This of course translates to the maintenance of a constant temperature for the mounted electronic component. Decreased heat rejection by condenser 15 is due to the fact that the inert gas temperature is lower than that of the working fluid vapor and the inert gas heat transfer coefficient is significantly lower than the vapor condensation heat transfer film coefficient in the unblocked portion of the condenser.

Figure 1A:
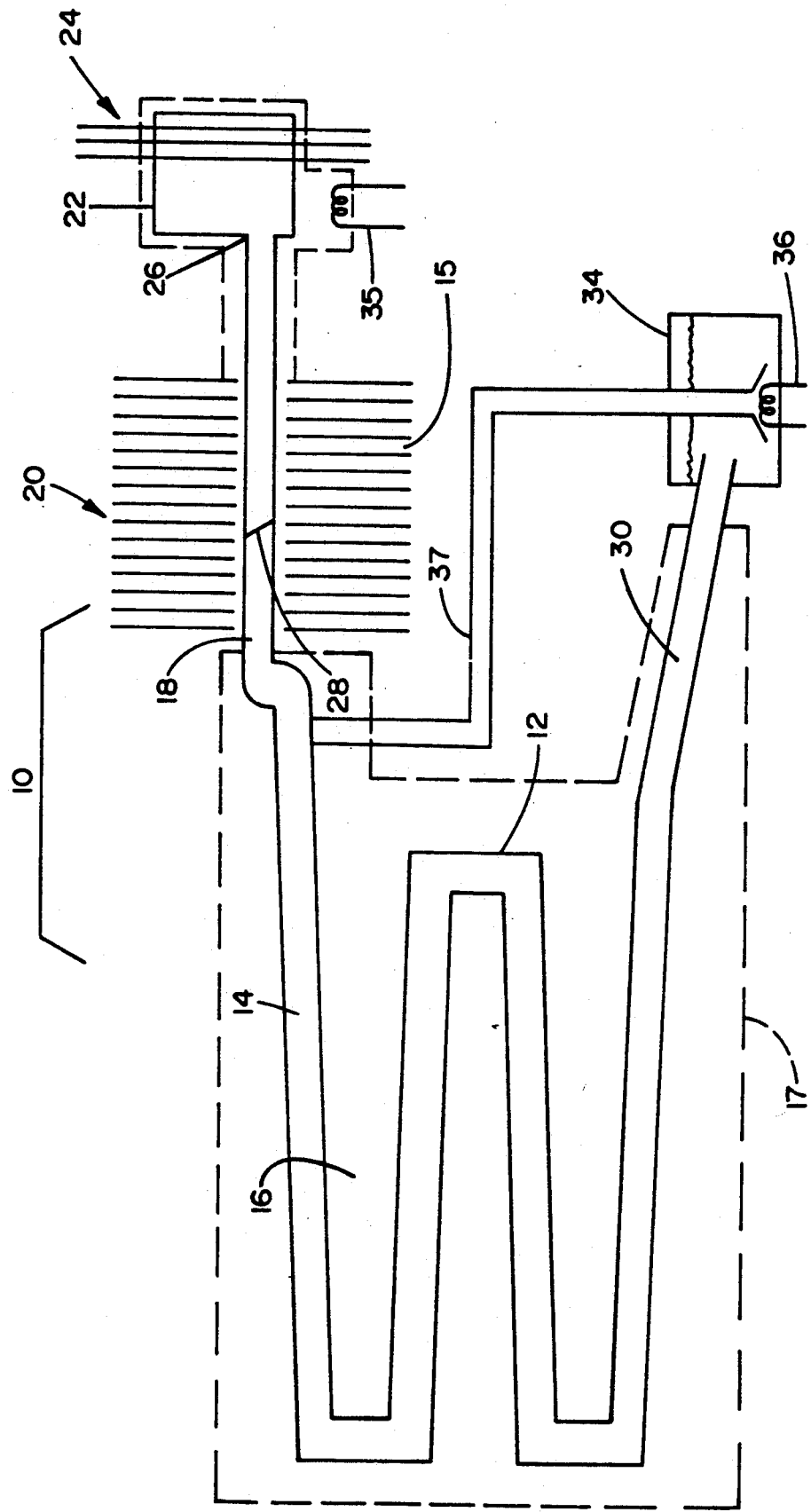
FIG. 1A is a diagrammatic illustration of an alternate VCHP construction in accordance with the present invention.

Thus far described, the present invention includes a variable conductance heat pipe which exists in the prior art. However, such assemblies often discontinue service when transient heat swings from electronic components dry out any working fluid liquid existing in the heat pipe. Accordingly, in order to avoid this, the present VCHP includes a sump 30 located at the gravitationally lowest point in the passage 14. A sump heater 32 vaporizes the working fluid which, after condensing, flows through the evaporator into the sump, thereby maintaining a constant circulation of working liquid and vapor. Vapor is condensed by the airflow over the condenser fins 20 while the working fluid liquid recirculates back to the sump 30, by gravity feed along the lower portion of passage 14. Alternatively, as shown in FIG. 1A, one may include a bubble pump 34 of conventional design powered by a bubble pump heater 36 for providing a continuous circulation of liquid through the internal passage 14 by means of the pump discharge line 37, resulting in less heater power than by reliance on a sump heater 32 alone. A second alternative, not illustrated, would substitute a mechanical pump in place of bubble pump 34 and heater 36.

Figure 2:
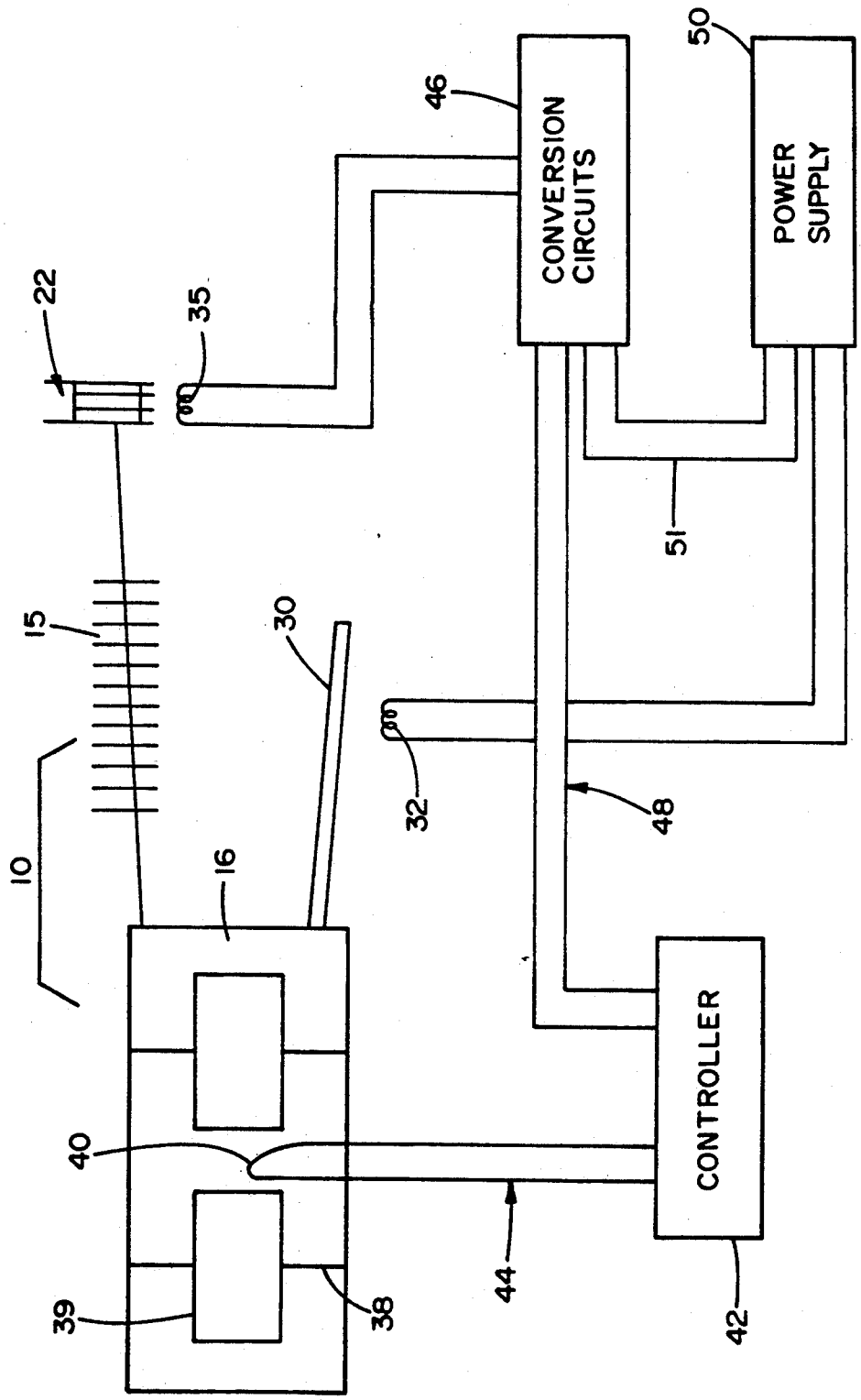
FIG. 2 is a schematic illustration of control system elements as employed in connection with the present invention.

FIG. 2 illustrates a further improvement over the prior art, namely, a feedback system for temperature control. In this figure, two electronic chips 39 are shown by way of example, mounted to heat sink 16, the conductive portions of the components as well as wires 38 thereto are appropriately electrically insulated from the metallic heat sink 16. A conventional thermocouple 40 is located in the body of the heat sink 16 so as to detect temperature variations. The output from the thermocouple is connected via leads 44 to a conventional thermocouple controller 42. The output signal from controller 42, which follows the actual temperature variations in heat sink (mounting plate) 16, is output to conventional operational amplifier conversion circuits 46 via connecting leads 48. The conversion circuits 46, which supply a variable power level to gas reservoir heating coils 35, are connected via leads 51 to a power supply 50. As previously explained in connection with FIG. 1, as the heat dissipated by electronic components mounted to heat sink 16 increases, the conversion circuits 46 decrease the power delivered to reservoir heating coil 35 so that the partial pressure of the vapor in the reservoir decreases. This causes the partial pressure of the inert gas to increase and its blocking displacement into condenser 15 is decreased. However, when an opposite situation results, namely a decrease of the heat dissipated by electronic components, the conversion circuits 46 increase the energization of the reservoir heating coil 35 resulting in an increase of the vapor partial pressure. This causes a decrease in the inert gas partial pressure and an increase in the blocking penetration of condenser 15.

FIG. 2 also indicates the connection of constant power supply 50 to the sump heater 32 so as to provide a constant heat input to the vaporizable liquid present in the sump. Of course, if a sump bubble pump were employed as indicated in FIG. 1A, it would likewise be connected to power supply 50.

Accordingly, the previous description of the invention makes it clear that a variable conductance heat pipe heat sink can operate at a constant and uniform temperature by including a sump that is heated or pumped to ensure a constant working fluid flow through the heat pipe. Further, successful performance by the present invention requires the utilization of a closed feedback control loop. The result is the maintenance of heat sensitive electronic components at a constant temperature.

It should be understood that the invention is not limited to the exact details of construction shown and described herein for obvious modifications will occur to persons skilled in the art.

We claim:

1. A temperature adjustable variable conductance heat pipe having a condenser and an evaporator including
   (a) a metallic heat sink body onto which electronic components are mounted; and
   (b) an internal passage communicating with the condenser, and extending through the heat sink body to an external low point;
      a sump connected to the low point, where working fluid collects after being gravity fed from the condenser;
      means associated with the sump for causing constant circulation of liquid from the sump through the heat pipe to avoid drying of the passage during transients of externally generated input heat;
      a reservoir communicating with the passage in the condenser and containing an inert gas which variably blocks penetration of working fluid in the condenser thereby adjusting the conductance of heat therefrom;
      means for thermally sensing temperature variations in the heat sink body due to variations of the input heat; and
      means connected between the thermal sensing means and the inert gas reservoir for varying expansion of the gas into the condenser, in inverse relation to the rise in temperature of the evaporator, thereby maintaining a constant and uniform temperature distribution therein.

2. A method for maintaining a heat pipe heat sink mounting surface at a uniform and constant temperature, the method comprising the steps:
   mounting an electronic circuit to a surface existing on an evaporator of the heat pipe;
   circulating working fluid between the evaporator and condenser of the heat pipe through a passage therebetween, the passage extending through the heat sink body to an external low point;
   introducing expandable inert gas into the condenser from an end opposite that of the evaporator thereby blocking penetration of the working fluid vapor into the condenser and hence the rate of heat dissipation by the evaporator;
   varying the degree of inert gas introduction in inverse relation to the temperature of the evaporator; and
   continuously feeding working fluid from a sump, located at the low point, back through the evaporator for preventing drying out of the working fluid.

* * * * *